(12) United States Patent
Morovic et al.

(10) Patent No.: US 10,688,774 B2
(45) Date of Patent: Jun. 23, 2020

(54) PROCESSING OBJECT PART DATA FOR A THREE-DIMENSIONSAL OBJECT

(71) Applicant: Hewlett-Packard Development Company, L.P., Houston, TX (US)

(72) Inventors: Jan Morovic, Colchester (GB); Peter Morovic, Sant Cugat del Valles (ES); Jay S. Gondek, Vancouver, WA (US); William J. Allen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 89 days.

(21) Appl. No.: 15/564,411

(22) PCT Filed: Jul. 15, 2015

(86) PCT No.: PCT/US2015/040610
§ 371 (c)(1),
(2) Date: Oct. 4, 2017

(87) PCT Pub. No.: WO2017/011009
PCT Pub. Date: Jan. 19, 2017

(65) Prior Publication Data
US 2018/0134028 A1 May 17, 2018

(51) Int. Cl.
*B33Y 50/02* (2015.01)
*B29C 64/386* (2017.01)
(Continued)

(52) U.S. Cl.
CPC ............ *B33Y 50/02* (2014.12); *B29C 64/386* (2017.08); *G05B 19/4099* (2013.01);
(Continued)

(58) Field of Classification Search
None
See application file for complete search history.

(56) References Cited

U.S. PATENT DOCUMENTS

| 8,651,167 B1 | 2/2014 | Hasenbusch |
| 2008/0070159 A1 | 3/2008 | Ramos et al. |

(Continued)

FOREIGN PATENT DOCUMENTS

| WO | WO-2011/098609 | 8/2011 |
| WO | WO-2013113372 | 8/2013 |

OTHER PUBLICATIONS

International Search Report and Written Opinion dated Jun. 3, 2016, PCT Patent Application No. PCT/US2015/040610, filed Jul. 15, 2015, Korean Intellectual Property Office.

(Continued)

*Primary Examiner* — Carlos R Ortiz Rodriguez
(74) *Attorney, Agent, or Firm* — HP Inc. Patent Department

(57) ABSTRACT

Certain examples described herein relate to the preprocessing of object data for the manufacture of a three-dimensional object. In one case, the object data represents at least a first and a second object portion, the first object portion being associated with a first production material composition and the second object portion being associated with a second production material composition. The first and the second object portions may be arranged such that they comprise a contiguous interface. In certain described cases, the object data is modified by modulating the contiguous interface. Said modulating the contiguous interface may comprise modulating data defining at least one of the first and the second object parts such that a portion of at least one of the first and second production material compositions extends into object space occupied by a respective one of the second and first object parts. The resultant modified object data may be used to manufacture the three-dimensional object.

15 Claims, 4 Drawing Sheets

(51) Int. Cl.
　　　*G06F 30/00* 　　　(2020.01)
　　　*G05B 19/4099* 　　(2006.01)
　　　*G06T 17/20* 　　　(2006.01)
　　　*H04N 1/405* 　　　(2006.01)

(52) U.S. Cl.
　　　CPC .............. *G06F 30/00* (2020.01); *G06T 17/20* (2013.01); *H04N 1/405* (2013.01)

(56) References Cited

U.S. PATENT DOCUMENTS

| | | |
|---|---|---|
| 2014/0039663 A1 | 2/2014 | Boyer et al. |
| 2014/0074274 A1 | 3/2014 | Douglas et al. |
| 2014/0099476 A1 | 4/2014 | Subramanian et al. |
| 2014/0271961 A1 | 9/2014 | Khoshnevis |
| 2014/0324204 A1 | 10/2014 | Vidimce et al. |
| 2015/0035889 A1 | 2/2015 | Nakano et al. |

OTHER PUBLICATIONS

Doubrovski, E.L. et al., "Voxel-based Fabrication Through Material Property Mapping: a Design Method for Bitmap Printing", Elsevier, Dec. 2, 2014, pp. 11. http://matter.media.mit.edu/assets/pdf/Voxel-based_Fabrication_through_Material_Property_Mapping-_a_Design_Method_for_Bitmap_Printing.pdf.

Cho el al.; "A dithering algorithm for local composition control with three-dimensional printing", Computer Aided Design, Elsevier Publishers BV., Barking, GB, vol. 35, No. 9, Aug. 1, 2003 (Aug. 1, 2003) , pp. 851-867.

Lou et al.; "Fundamentals of 3D halftoning" In: "Medical image computing and computer-assisted intervention—MICCAI 2015 : 18th international conference, Munich, Germany, Oct. 5-9, 2015; proceedings" Jan. 1, 1998 (Jan. 1, 1998), pp. 224-239.

PROCESSING OBJECT PART DATA FOR A THREE-DIMENSIONSAL OBJECT

CLAIM FOR PRIORITY

The present application is a national stage filing under 35 U.S.C. § 371 of PCT application number PCT/US2015/040610, having an international filing date of Jul. 15, 2015, the disclosure of which is hereby incorporated by reference in its entirety.

BACKGROUND

Apparatus that generate three-dimensional objects, including those commonly referred to as "3D printers", have been proposed as a potentially convenient way to produce three-dimensional objects. These apparatus typically receive a definition of the three-dimensional object in the form of an object model. This object model is processed to instruct the apparatus to produce the object using at least one production material. These production materials may comprise a combination of agents and powdered substrates, heated polymers and/or liquid solutions of production material. The processing of an object model may be performed on a layer-by-layer basis. It may be desired to produce a three-dimensional object with at least one property, such as color, mechanical and/or structural properties. The processing of the object model may vary based on the type of apparatus and/or the production technology being implemented.

BRIEF DESCRIPTION OF THE DRAWINGS

Various features of the present disclosure will be apparent from the detailed description which follows, taken in conjunction with the accompanying drawings, which together illustrate, by way of example, features of the present disclosure, and wherein.

DETAILED DESCRIPTION

Figure 1A:
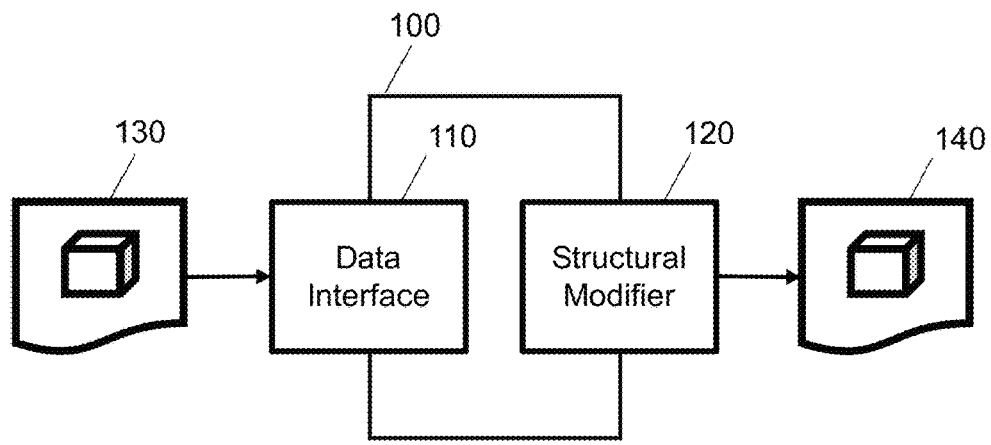
FIG. 1a is a schematic diagram showing an apparatus for preprocessing object data for the manufacture of a three-dimensional object according to an example.

In the production of three-dimensional objects, e.g. in so-called "3D printing", there is a challenge to control the structure of generated objects. For example, it may be desired to produce objects with a variety of structural properties, which may influence, or be influenced by, material properties and/or mechanical properties of a produced object. There is also a desire to flexibly control the structure of produced objects. In certain cases, it may be desired to control interfaces between different portions of a generated three-dimensional object, wherein the different portions comprise different material compositions. In particular, it may be desired to control the adhesive properties and/or the structural strength of objects which contain such interfaces, since the material compositions used either side of such interfaces may have differing structural, mechanical and/or fusing properties. Abrupt, contiguous interfaces between such differing materials may produce areas of local structural weakness in the manufactured object, and may act to reduce the overall structural integrity of the object. For example, this may be the case where an object has a "shell" portion and a "core" portion, wherein each portion is to be manufactured using a different material composition. It may therefore be desired to produce strong, adhesive interfaces between material compositions. This may be useful when two object portions are not otherwise mechanically compatible. In certain cases, it may also be desired to control the structural properties of such interfaces without having to re-design or re-generate the object model. As may be appreciated, such considerations are not present with two-dimensional printing.

Certain examples described herein enable object data for the manufacture of a three-dimensional object to be preprocessed. Object data is received, which is representative of the three-dimensional object for manufacture. The received object data represents at least a first and a second object part. The first object part is associated with a first production material composition and the second object part is associated with a second production material composition. The first and the second object parts are arranged such that they are separated by a contiguous interface. For example, this object data may be a model file that is to be sent for "3D printing".

In certain described examples, the received object data is modified by modulating the contiguous interface between the first and the second object parts. Modulating the contiguous interface may comprise modulating data defining at least one of the first and the second object parts, such that a portion of at least one of the first and the second production material compositions extends into object space occupied by a respective one of the second and first object parts. The modified object data may then be used, e.g. in a halftone thresholding operation, to generate control data for use in manufacturing the object. For example, the output of the halftone thresholding operation may comprise deposit or material formation instructions for an additive manufacturing system. By modulating the contiguous interface in this way, the manufactured three-dimensional object may comprise a mechanically strong interface, despite the first and the second production material compositions having potentially different structural properties. Instead of relying, for structural integrity, on adhesion between the two material compositions when arranged around an abrupt contiguous interface, certain described examples result in an interlocking interfacial structure, wherein the interfacial region comprises partially enclosed regions of each material composition.

Certain examples described herein enable various printing materials to adhere to various other printing materials during manufacture of a three-dimensional object. Certain examples described here enable a three-dimensional object with an interface between two different material compositions to be produced while maintaining a flexibility of architectural choices associated with printing objects in which such material differences between adjacent object parts are desired. Certain examples also enable the production of strong core-shell structures, wherein the core and the shell comprise different material compositions and the mechanical properties of the core-shell structure may be a consideration. Certain examples also enable the production of strong, robust structures even when the printing materials used are highly incompatible (e.g. silicone and aluminum).

Certain examples also enable a desired interfacial modulation to be applied without modifying a substantial portion of an object processing pipeline. These examples also reduce the need for specific choices to be made during the design of the object, e.g. volumes or object models of the designed object need not exhibit the desired interfacial modulation when the object is sent for production. This is achieved by allowing choices associated with the interfacial modulation to be made at a stage in an object processing pipeline after design yet before production of the object, e.g. such as when a designed object is submitted as a "3D print job". The specific modulation of a contiguous interface between two object portions may vary depending on at least one of: the material compositions associated with each object portion, the relative thickness of each object portion, and a desired structural property of the interface between the object portions. The modulation of the contiguous interface may further vary depending on at least one of: a pre-defined transition radius, an error diffusion halftone operation, and at least one three-dimensional halftone threshold matrix. Additionally, the modulation of the contiguous interface may vary depending on at least one of: the geometry of a substructure to apply to the interface, the material composition of such a substructure, and the domain in which such a substructure is applied.

FIG. 1a shows an example of an apparatus 100 arranged to preprocess object data for the manufacture of a three-dimensional object. The apparatus 100 comprises a data interface 110 and a structural modifier 120. The data interface 100 is arranged to receive object data 130 representative of the three-dimensional object for manufacture. The object data 130 represents at least a first and a second object part. The first object part is associated with a first production material composition, and the second object part is associated with a second production material composition. For example, in an object file, a first object part may be designated as having a first object property, e.g. a first color, material and/or material property may be associated with a particular geometric shape or selection of voxels. A second object part may then be designated as having a second object property, e.g. a second color, material and/or material property may be associated with another geometric shape or selection of voxels. The first and the second object parts are arranged such that they are separated by a contiguous interface. In one example, one of the first and second object parts may represent a core of the three-dimensional object, and the other of the first and second object parts may represent a shell of the three-dimensional object. In this example, the shell may be arranged to surround the core. A "contiguous" interface may be said to be a common border between the two parts wherein each part is adjacent to the other. For example, the border may comprise a planar or continuously-curved interface, wherein each part has a smooth surface where there are no discontinuities and wherein both surfaces abut each other.

The structural modifier 120 is arranged to modify the object data 130 by modulating the contiguous interface between the first and the second object parts. Modulating the contiguous interface comprises modulating data defining at least one of the first and the second object parts such that at least one of the first and second production material compositions extends into object space occupied by a respective one of the second and first object parts. The structural modifier 120 may, according to one example, output modified object data 140. The structural modifier 120 may, according to one example, be arranged to replace object data for the contiguous interface with object data representing a plurality of repeated geometric substructures. The plurality of repeated geometric substructures may be composed of at least one of the first and the second production material compositions. Each substructure may be arranged to extend into object space occupied by a respective one of the second and first object parts. Each geometric substructure may, in one example, comprise at least one concavity. In one example, each geometric substructure may be aligned with respect to the normal of the contiguous interface. In another example, each geometric substructure may be arranged independently of the geometry of the contiguous interface.

Figure 1B:
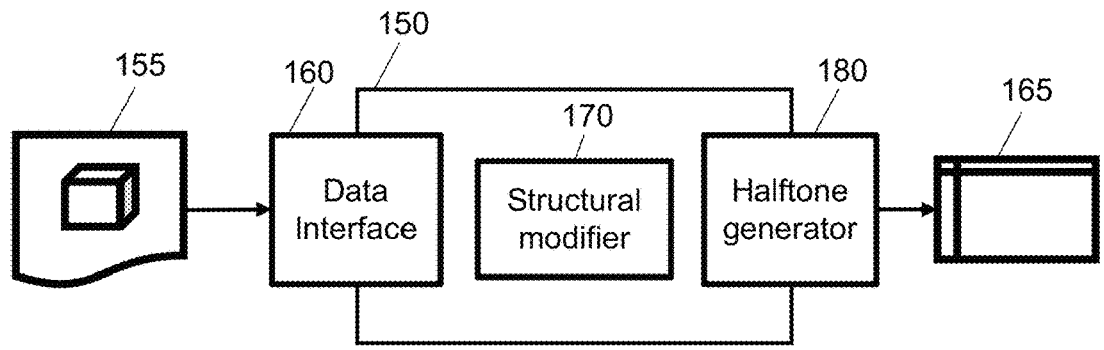
FIG. 1b is a schematic diagram showing an apparatus for preprocessing object data for the manufacture of a three-dimensional object according to an example.

FIG. 1b shows an example of an apparatus 150 arranged to preprocess object data for the manufacture of a three-dimensional object. The apparatus 150 comprises a data interface 160 and a structural modifier 170. The data interface 160 and structural modifier 170 are arranged as described with reference to the data interface 110 and structural modifier 120 of FIG. 1a. The apparatus 150 further comprises a halftone generator 180. The halftone generator 180 is arranged to apply a halftoning operation to object data 155 and to output discrete material formation instructions 165 for the manufacture of the three-dimensional object. These may comprise deposit instructions, e.g. for the deposit of at least one agent onto a powdered substrate or for the deposit of an extruded polymer, and/or material arrangement and formation instructions, e.g. control instructions for guiding a laser device to heat a liquid or solid material.

To generate the instructions 155 the halftone generator 180 can process the data 155 in association with a three-dimensional threshold matrix. In certain cases this may comprise comparing at least a portion of the data output by the structural modifier 170 to a corresponding portion of a three-dimensional threshold matrix or an equivalent operation. In one case, the halftone generator 180 can perform a halftone thresholding operation on a material-use value associated with a volume of the data 155, such as a voxel, using a halftone threshold value retrieved from a location in the three-dimensional threshold matrix that corresponds to that volume. In an additive manufacturing system with a bi-level deposit mechanism, this may comprise outputting deposit instructions in the form of "deposit material" (e.g. "1") or "do not deposit material" (e.g. "0"). For example, if a material-use value for a given voxel was 65% and the retrieved halftone threshold value was 50% then as the material-use value is above the threshold value a deposit instruction of "1" may be output for the given voxel. This may be actuated as a deposit of the production material at an output location corresponding to the given voxel. In certain systems, the output may comprise one of a set of material formation states for a given volume of the three-dimensional object at a production resolution, e.g. a volume of an output object that is addressable using an additive manufacturing system and whose output material state may be modified by selective actions of the system.

In the example of FIG. 1b, the structural modifier 170 may be arranged, in one case, to modulate the contiguous interface in the received object data 155 to generate a halftone transition region for the contiguous interface. The halftone transition region comprises material composition placement instructions for manufacture of the three-dimensional object, wherein volumes of the first production material composition are interleaved with volumes of the second production material composition. The generation of the halftone transition region may, in one example, be based on a predefined transition radius (e.g. for a curved shell-core case) or width.

The structural modifier 170 may, according to one example, be arranged to modify the contiguous interface by configuring a set of material volume coverage vectors for a set of respective volumes of the three-dimensional object, prior to an application of a halftoning operation by the halftone generator 180. Said set of respective volumes of the three-dimensional object may correspond to portions of at least one of the first and second object parts that are included in a halftone transition region. In this example, for k materials available for manufacture of the three-dimensional object and L discrete material formation states for said materials, a material coverage vector may comprise $L^k$ vector components, each vector component having an associated probability value. The structural modifier 170 may be arranged to configure the set of material volume coverage vectors to have non-zero probability values for at least one of: vector components respectively representing the first and second production material compositions individually; and a vector component representing a combination of the first and second production material compositions. In this way, each object part is associated with a volumetric mixture of production material compositions whereas previously these were delineated.

In one example, the structural modifier 170 may be arranged to modulate the contiguous interface by modifying an error diffusion halftoning operation performed by the halftone generator 180. In another example, the structural modifier 170 may be arranged to modulate the contiguous interface by modifying at least one three-dimensional threshold matrix used by the halftone generator 180. In a further example, the halftone generator 180 may be arranged to modulate the contiguous interface by replacing object data for the contiguous interface with object data representing a plurality of repeated geometric substructures composed of at least one of the first and the second production material compositions, each substructure being arranged to extend into object space occupied by a respective one of the second and first object parts.

In one implementation, the object data 130, 155 comprises, or is used to generate, at least one material volume coverage vector for at least one volume of the three-dimensional object. A material volume coverage vector represents a probabilistic distribution of materials available to an additive manufacturing system for production of the three-dimensional object. In one case, each vector represents a proportional volumetric coverage of materials available for production of the three-dimensional object and combinations of said materials, i.e. available production material compositions. For example, for k materials available for production of the three-dimensional object and L discrete material formation states for said materials, the material coverage vector comprises $L^k$ vector components, each vector component having an associated probability value. In this case, the discrete deposit instructions comprises production instructions from a set of L*k available instruction values, each element at a production resolution having one of L material formation state instructions for each of said k materials. The materials and material combinations defined by the material volume coverage vector may be associated with a number of different material types, e.g. build materials, finishing materials, support or scaffolding materials, agents and powders, including separate use of materials, joint use of materials, and an absence of any materials.

To explain the components of a material volume coverage vector, a simple example may be considered. In this simple example, an apparatus can use two materials to generate a three-dimensional object: M1 and M2. These may be fluid build materials that are deposited on a substrate or platen, e.g. excreted or ejected molten polymers, or they may comprise two deposit-able colored agents that are deposited on at least one layer of powdered build material. In the latter case, in a produced three-dimensional object, each "material" may correspond to a coalesced combination of the deposit-able agent and a powdered build material. In the former case, in a produced three-dimensional object, each "material" may correspond to a solidified portion of excreted or ejected polymer. In any case, each "material" is deposit-able by an additive manufacturing apparatus to generate a defined volume (e.g. at the production resolution) of an output three-dimensional object.

In this simple example, if the additive manufacturing apparatus can deposit discrete amounts of each material, e.g. in binary deposits, there are four different material combination states: a first state for the deposit of M1 without M2; a second state for the deposit of M2 without M1; a third state for the deposit of both M1 and M2, e.g. M2 deposited over M1 or vice versa; and a fourth state for an absence of both M1 and M2, e.g. "blank" (Z) or an inhibitor. In this case, the material volume coverage vector has four vector components: [M1, M2, M1M2, Z]. In the case of the last vector component, "blank" or "Z" may represent "empty" or an absence of materials in a processed layer, e.g. if agents are deposited on layers of build material this may denote an absence of build material for the processed layer, even though the build material may not be removed until the complete object has been produced.

In one case, the apparatus 100, 150 may be implemented as part of an additive manufacturing system, e.g. may comprise electronics or portions of an embedded controller for a "3D printer". In another case, at least one portion of the apparatus 100 may be implemented as executable code, stored on a non-transitory storage medium, that includes instructions, that when executed by at least one processor, causes the processor to perform the functionality of the at least one portion of the apparatus 100, 150 described herein. This executable code may additionally access data from at least one volatile or non-volatile memory, such as random access memory, read-only memory and/or hard disk drives. The at least one processor may form part of an additive manufacturing system (e.g. a computing module of a "3D printer") and/or may form part of a computer device communicatively coupled to the additive manufacturing system (e.g. a desktop computer configured to control a "3D printer" and/or a "3D print driver" installed on the computer device). In one case, the computer device may comprise a server communicatively coupled to an additive manufacturing system; e.g. a user may submit the data 155 defining the three-dimensional object from a mobile computing device for processing by the apparatus 150 "in the cloud", the apparatus 150 may then send the material formation instructions 165 to an additive manufacturing system via a network communications channel. In one case, at least one portion of the apparatus 100, 150 may be implemented as at least one application-specific integrated circuit (ASIC). The ASIC may be standard, fully customized or partially customized. In one example, the ASIC may have a structured design. The ASIC may comprise at least one microprocessor and/or at least one memory block. In another example, the ASIC may comprise at least one gate array, e.g. a field-programmable gate array. The field-programmable gate array may comprise an array of programmable logic blocks and a hierarchy of reconfigurable interconnects. The array of programmable logic blocks may, in certain examples, comprise memory elements, e.g. flip-flops. The ASIC may, in one example, be arranged to receive the data 130, 155 defining the three-dimensional object. The ASIC may be communicatively coupled to at least one central processing unit, according to one example. The data 130, 155 may be accessed by the at least one central processing unit. The at least one central processing unit may comprise at least one of a general-purpose central processing unit and a specific-purpose central processing unit. The ASIC and/or the central processing unit may be arranged to operate at least one of the structural modifier 120, 170 and the halftone generator 180, according to certain examples.

Figure 2:
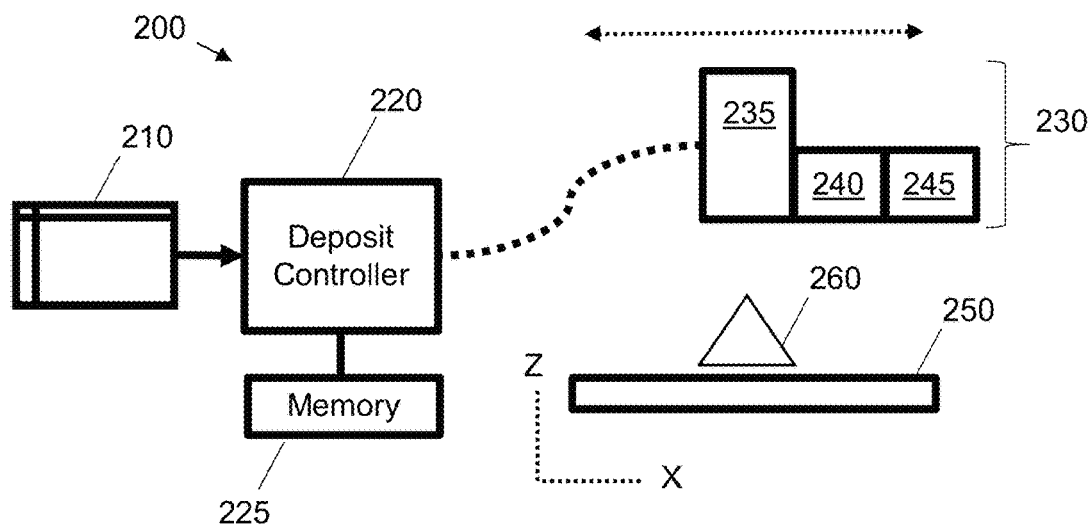
FIG. 2 is a schematic diagram showing an apparatus for production of a three-dimensional object according to an example.

An example of an apparatus arranged to manufacture a three-dimensional object according to the modified object data 140 will now be described with reference to FIG. 2. FIG. 2 shows an example of an apparatus 200 arranged to produce a three-dimensional object 260. The apparatus 200 can receive data 210 for the three-dimensional object, which may comprise material formation instructions based on the modified object data 140 or 165 as described below. In one case, at least one portion of the apparatus 200 may be implemented as executable code, stored on a non-transitory storage medium, that includes instructions, that when executed by at least one processor, causes the processor to perform the functionality of the at least one portion of the apparatus 200 described herein. Apparatus 200 is shown and described for better understanding of the presently described examples; other apparatus of a different form and/or using a different technology may alternatively be used.

In FIG. 2, the apparatus 200 comprises a deposit controller 220 and a memory 225. The deposit controller 220 may comprise at least one processor that forms part of an embedded computing device, e.g. adapted for use in controlling an additive manufacturing system. Memory 225 may comprise volatile and/or non-volatile memory, e.g. a non-transitory storage medium, arranged to store computer program code, e.g. in the form of firmware. Firmware may comprise machine readable instructions and/or executable code that comprises instructions for at least one processor. The deposit controller 220 is communicatively coupled to aspects of the apparatus that are arranged to construct the three dimensional object. These comprise a deposit mechanism 230. The deposit mechanism 230 can deposit production materials to generate the three-dimensional object. In the present case, the deposit mechanism comprises a substrate supply mechanism 235 and an agent ejection mechanism 240, 245. In other cases the deposit mechanism 230 may comprise fewer or additional components, e.g. a substrate supply mechanism may be provided separately from the agent ejection mechanism or omitted, or other components, e.g. the deposit mechanism 230 may comprise a polymer extraction mechanism. In the schematic example of FIG. 2, the agent ejection mechanism 240, 245 comprise two components: a first component 240 for the supply of a first agent (e.g. material M1 as discussed above) and a second component 245 for the supply of a second agent (e.g. material M2 as discussed above). Two materials are presented in this example for ease of explanation but any number of materials may be supplied. Similar materials in the form of agents are described for example only. The substrate supply mechanism 235 can supply at least one substrate layer upon which the materials available for production are deposited by the agent ejection mechanism 240, 245 to produce the three-dimensional object 260. In the present case, the materials comprise agents that are applied to a powder substrate, wherein the combination of agent and powder, following a curing process, form part of the object. However, other implementations are possible, e.g. the materials may be deposited to form part of the object, e.g. as per the polymer case discussed above. In the example of FIG. 2, the three-dimensional object 260 is built layer by layer on a platen 250. The arrangement of the aspects and components shown in FIG. 2 are not limiting; the exact arrangement of each apparatus will vary according to the production technology that is implemented and the model of apparatus.

In the example of FIG. 2 the deposit controller 220 is configured to process and/or otherwise use the data 210 to control at least one component of the deposit mechanism 230. The deposit controller 220 may control at least one of the substrate supply mechanism 235 and the agent ejection mechanism 240, 245. For example, the discrete material formation instructions in the data 210 may be used by the deposit controller 220 to control nozzles within the agent ejection mechanism. In one implementation the apparatus 200 may be arranged to use at least one coalescing agent and a coalescing modifier agent that are respectively supplied by the components of the agent ejection mechanism 240, 245. These agents allow a three-dimensional object to have varying material properties. They may be combined with at least one colored powdered substrate material, e.g. applied using an inkjet mechanism to deposited powder layers, to generate multi-color objects with varying material properties. If a plurality of powdered substrate materials are available they may also form part of the "materials" of the material volume coverage vector in certain cases. Similarly, in one case at least one coalescing agent or binder may be colored and deposited onto a white or blank powdered substrate. In these cases the generated objects may be constructed by depositing at least the coalescing agent and the coalescing modifier agent on layers of substrate material, e.g. layers of powder or other material forming z-plane slices, followed by the application of energy to bind the material, e.g. infra-red or ultra-violet light. For example, at least one of the substrate supply mechanism 235 and the agent ejection mechanism 240, 245 may be moveable relative to the platen 250, e.g. in at least one of the x, y and z directions (wherein the y axis is into the sheet for FIG. 2). At least one of the substrate supply mechanism 235, the agent ejection mechanism 240, 245 and the platen 250 may be moveable under control of the deposit controller 220 to achieve this. Additionally, at least one printing fluid may also be deposited on coalesced and/or uncoalesced layers, wherein this printing fluid also forms part of the "materials" of the material volume coverage vector. In other implementations the apparatus may comprise part of, amongst others, selective laser sintering systems, stereo lithography systems, inkjet systems, fused deposition modelling systems, any three-dimensional printing system, inkjet deposition systems and laminated object manufacturing systems. These include apparatus that directly deposit materials rather than those described that use various agents.

In one case, the functionality of the apparatus 100, 150 and the deposit controller 220 may be combined in one embedded system that can receive the data 130, 155 defining the three-dimensional object, or data useable to produce this, and control the apparatus 200 accordingly. This may be the case for a "stand alone" apparatus that can receive data 210, e.g. by physical transfer and/or over a network, and produce an object. For example, this apparatus may be communicatively coupled to a computer device that can send a "print job" comprising the object definition 130, 155, or data useable to produce the object definition 130, 155, to the apparatus in the manner of a two-dimensional printer.

Figure 3A:
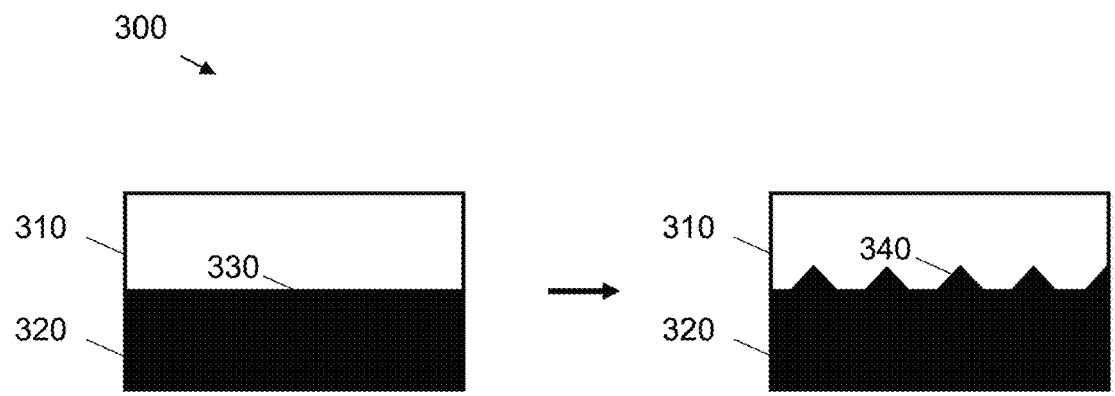
FIG. 3a is a schematic illustration showing a representation of a cross-section of a three-dimensional object according to an example.

FIG. 3a shows schematically a representation 300 of a cross-section of a three-dimensional object according to an example. The representation 300 is shown both before and after object data representative of the three-dimensional object is modified by the structural modifier 120, 170. The three-dimensional object comprises a first object portion 310 and a second object portion 320. The first object portion 310 is associated with a first production material composition (shown in this representation as white). The second object portion 320 is associated with a second production material composition (shown in this representation as black). The first and second object portions 310, 320 are arranged such that they comprise a contiguous interface 330. Following the modifying of object data representative of the three-dimensional object 300, the contiguous interface 330 is modulated such that a portion of the second production material composition (black) extends into object space occupied by the first object portion 310. In the example of FIG. 3a, the contiguous interface 330 is replaced with a plurality of repeated geometric substructures 340. Each substructure 340 is composed of the second production material composition (black) and extends into object space occupied by the first object portion 310. In this example, the geometric substructures 340 comprise tetrahedra or pyramids. In other examples, the geometric substructures 340 may comprise one or more of rectangular, wave-like, hook-like or tree-like substructures. In one example, the substructures 340 may comprise fractal structures. The geometric substructures 340 may, in one example, comprise at least one concavity. In one example, the geometric substructures 340 may be arranged such that, although they extend into object space occupied by the first object portion 310, they remain connected to the second object portion 320.

According to other examples, the geometric substructures 340 may be composed of the first production material composition (white) and may extend into object space occupied by the second object portion 320. In one example, a first portion of the geometric substructures 340 may be composed of the first production material composition (white) and extend into object space occupied by the second object portion 320, and a second portion of the geometric substructures 340 may be composed of the second production material composition (black) and extend into object space occupied by the first object portion 310. The decision of which production material composition to extrude into which may be based, according to one example, on the properties of the production material compositions in question. In another example, said decision may be based on the thickness of at least one of the first and the second object portions 310, 320 in the three-dimensional object as defined by the object data representation 300. In one example, the geometric substructures 340 may be arranged such that there is a constant density of substructures positioned along the interface 330. In another example, the substructures 340 may be arranged such that the density of substructures along the interface 330 is varied. The varying of substructure density may be based on at least one of the position of the substructures along the interface 330, the position of the interface in the three-dimensional object, and the production material compositions used for the first and the second object portions 310, 320. The geometric substructures may be either symmetrical or asymmetrical structures. Asymmetrical structures may be arranged with a plurality of different orientations. In one example, a first portion of the geometric substructures 340 may be arranged with a first orientation, and a second portion of the geometric substructures 340 may be arranged with a second orientation.

Figure 3B:
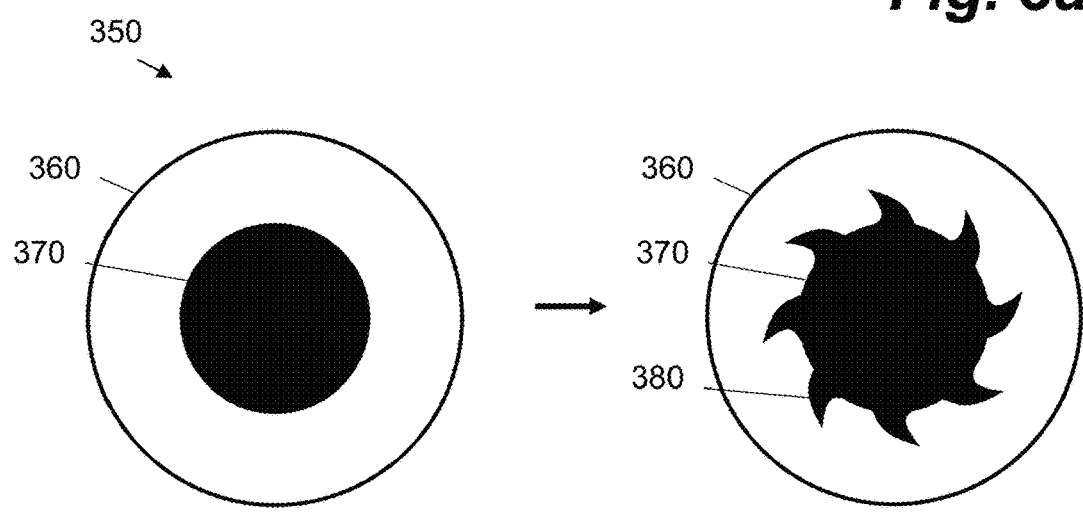
FIG. 3b is a schematic illustration showing a representation of a cross-section of a three-dimensional object according to an example

FIG. 3b shows schematically a representation 350 of a cross-section of a three-dimensional object according to an example. The representation 350 is shown both before and after object data representative of the three-dimensional object is modified by the structural modifier 120, 170. The three-dimensional object comprises a first object portion 360 and a second object portion 370. The first object portion 360 is associated with a first production material composition (shown in this representation as white). The second object portion 370 is associated with a second production material composition (shown in this representation as black). The first and second object portions 360, 370 are arranged such that they comprise a contiguous interface. In the example shown in FIG. 3b, the second object portion 370 is a core or interior of the three-dimensional object. The core or interior may be a sphere, a hemisphere, or any other three-dimensional structure. The first object portion 360 in this example is a shell or exterior of the three-dimensional object. The shell is arranged to surround the core, such that, upon manufacture of the three-dimensional object, at least a part of the second object portion 370 may be concealed by the first object portion 360. The first and the second object portions 360, 370 may be separate structures, according to one example. In one example, the first object portion 360 may be a coating arranged to coat at least a part of the second object portion 370.

Following the modifying of object data representative of the three-dimensional object 350, the contiguous interface is modulated such that a portion of the second production material composition (black) extends into object space occupied by the first object portion 360. In the example of FIG. 3b, the contiguous interface is replaced with a plurality of repeated geometric substructures 380. Each substructure 380 is composed of the second production material composition (black) and extends into object space occupied by the first object portion 360. In this example, the geometric substructures 360 comprise asymmetric wave-like structures. In this example, the geometric substructures are aligned normal to the contiguous interface. Such an alignment in this case results in a composite structure having rotational symmetry. In other examples, the geometric substructures may not be aligned normal to the contiguous interface. In particular, substructures which have concavities in all directions (e.g. star-like structures), may be aligned independently of the interfacial normal.

The replacing of object data for a contiguous interface with object data representing a plurality of geometric substructures, as described with reference to the examples shown in FIGS. 3a and 3b, may occur at different stages of a print production process, according to varying examples. In one example, the contiguous interface may be modulated into geometric substructures at the level of the input object geometry, early on in the printing pipeline. In another example, halftoned instantiations of the geometric substructures may be incorporated in slice halftones prior to printing. The latter case may be achieved by at least one of: accessing and modifying multiple halftone slices; and indexing into pre-halftoned geometric substructure slices.

Figure 4:
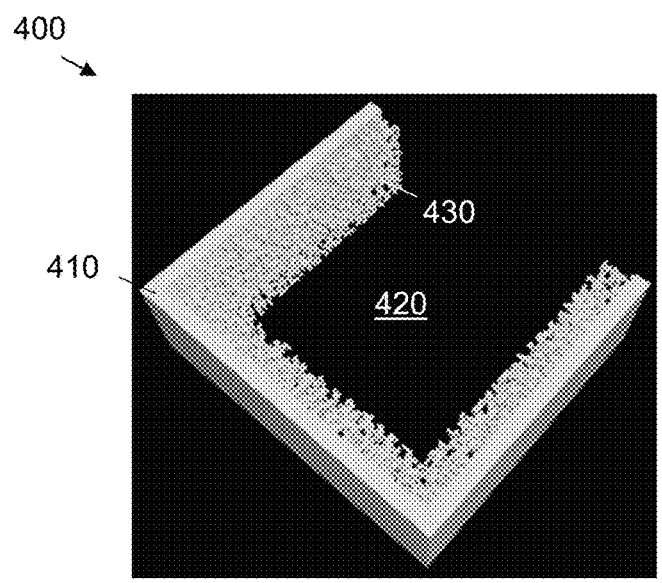
FIG. 4 is a graphic output of data defining a structure of a three-dimensional object as may be manufactured according to an example.

FIG. 4 shows an example graphic output of data defining a particular structure of a three-dimensional object 400 as may be produced using the examples described herein. The three-dimensional object 400 comprises a first object part 410 and a second object part 420. The first object part 410 is associated with a first production material composition (gray, in this representation), and the second object part 420 is associated with a second production material composition (black, in this representation). In this example, the first object part 410 is representative of a shell of the three-dimensional object 400, and the second object part 420 is representative of a core of the three-dimensional object 400. The first object part 410 is thus arranged to engulf the second object part 420. A contiguous interface between the first and the second object parts 410, 420 is modulated by the generation of a transition region 430. The transition region 430 may comprise material composition placement instructions for manufacture of the three-dimensional object 400, wherein volumes of the first production material composition are interleaved with volumes of the second production material composition. The generation of the transition region 430 may therefore be considered to diffuse the boundary defined by the contiguous interface. The transition region 430 may be generated in a contone domain, according to one example. In this case, object properties may be specified. In another example, the transition region 430 may be generated in a mapped domain, for example a domain that is defined by a material volumetric coverage representation, wherein specific material usages are already referred to. The generation of a transition region 430 in the domain of the material volumetric coverage representation may comprise determining, for a given volume, a convex combination of respective material volume coverage vectors. The weights for said convex combination may, according to an example, be based on the distance of the given volume from the interface between the first and the second object parts. In another example, the weights for said convex combination may be based on a pre-defined transition radius, e.g. a blurring radius.

The contiguous interface between the first and the second object parts 410, 420 may be modulated by configuring of a set of material volume coverage vectors for a set of respective volumes of the three-dimensional object 400 prior to application of a halftoning operation, according to an example. The set of respective volumes correspond to portions of at least one of the first and second object parts 410, 420 that are included in the halftone transition region 430. The set of material volume coverage vectors may be configured to have non-zero probability values for vector components respectively representing the first and second production material compositions individually, according to one example. In another example, the set of material volume coverage vectors may be configured to have non-zero probability values for a vector component representing a combination of the first and the second production material compositions. For example, if a transition region 430 is defined by a material volume coverage vector as having X % of a first material composition and (1−X) % of a second material composition, the result of halftoning is an interlocking set of volumes where the material compositions from either side of an interface are interleaved. In one example, the configuring of each material volume coverage vector may be based on the position of the respective volume in relation to the contiguous interface. The configuring may, in one example, be based on a predefined transition distance.

In one example, the contiguous interface between the first and the second object parts 410, 420 may be modulated by modifying an error diffusion halftoning operation. For error diffusion halftoning, material combinations are sequentially assigned to volumes and an octree model is used to describe where material combinations have already been assigned and where they have not. 'Closed' volumes are those which have already been assigned a material combination (e.g. from a material volume coverage vector) and 'open' volumes are those which are available. In order to modulate an interface between two object parts, the two object parts may be halftoned separately. In this instance, pre-defining which volumes are 'closed' for which of the material combinations allows for error diffusion of one object part to avoid filling volumes that error diffusion of the second object part will use, while avoiding the 'closed' volumes that are used with preference to the first object part. This may comprise modifying available 'open' volumes (e.g. voxels) for at least one of the first and second object parts to include volumes that form part of the other of the first and second object parts. In one example, material connectivity may be enforced in the error diffusion halftoning process. This results in a connected variable density stochastic structure at the interface between object parts.

The contiguous interface between the first and the second object parts 410, 420 may, according to one example, be modulated by modifying at least one three-dimensional threshold matrix used in a halftoning operation. In one example, different threshold matrices may be used for the different parts of the three-dimensional object's material use. If a threshold matrix, H, is used for the halftoning of the first object part, a matrix [1-H] may be used for the second object part. In this case, for a volume at location [x, y, z] in the second object part, the threshold value V of threshold matrix H may be replaced by a threshold value 1-V, where 1 represents a maximum encoded level value. The likelihood of avoiding combing the two material compositions may therefore be increased. In one example, an explicit co-optimization of the two threshold matrices, H and 1-H, may be performed.

Figure 5:
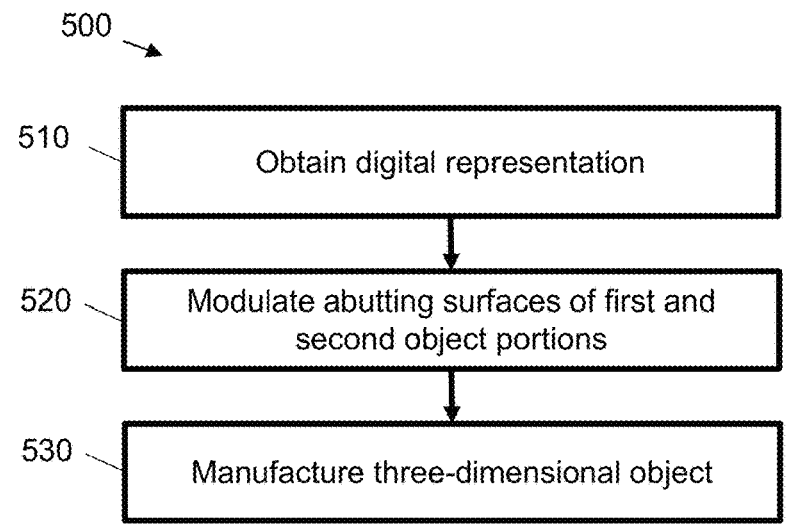
FIG. 5 is a flow diagram showing a method for manufacturing a three-dimensional object according to an example.

FIG. 5 shows a method 500 for manufacturing a three-dimensional object according to an example. This method may be applied by any one of apparatus 100 and deposit controller 220, by another additive manufacturing system or by a computer device arranged to control an additive manufacturing system. At block 510, a digital representation, e.g. object data, representative of the three-dimensional object to be manufactured, is obtained. The digital representation represents at least a first and a second object portion. The first object portion is associated with a first material composition and the second object portion is associated with a second material composition. The first and the second material compositions may be production material compositions. The first and the second object portions have abutting surfaces, e.g. they comprise a contiguous interface. At block 520, the abutting surfaces defined in the digital representation are modulated, e.g. the contiguous interface is modulated. The modulating the abutting surfaces includes causing an ingress of a portion of at least one of the first and second material compositions into a volume, e.g. object space, occupied by a respective one of the second and first object portions. The modulating the abutting surfaces may comprise extending a portion of at least one of the first and second material compositions into said volume. At block 530, the three-dimensional object is manufactured, based on the modulated surfaces in the digital representation. The manufacture at block 530 may, according to one example, comprise halftoning a digital representation of the three-dimensional object to output discrete material formation instructions for the at least two material compositions. The halftoning operation may, in one example, be applied in association with at least one halftone threshold matrix. In one example, the manufacture at block 530 may comprise depositing available production material compositions according to the discrete material formation instructions output by a halftoning operation.

In one case, object data in the form of a digital representation of a three-dimensional object may be at least derived from three-dimensional object model data received in a vector-based format, e.g. data from a STereoLithography ".stl" file. In certain cases this may be converted to a predetermined raster resolution. Vector-based formats represent a three-dimensional object using defined model geometry, such as meshes of polygons and/or combinations of three-dimensional shape models. For example, a ".stl" file may comprise a vector representation in the form of a list of vertices in three dimensions, together with a surface tessellation in the form of a triangulation or association between three vertices. The raster representation may comprise a plurality of defined unit voxels or custom voxels, e.g. defined volumes of at least one size.

In one case, at least one portion of the method 500 may be implemented by executable code, stored on a non-transitory storage medium, that includes instructions, that when executed by at least one processor, causes the processor to perform the at least one portion of the method 500 described herein. In another case, at least one portion of the method 500 may be implemented by at least one ASIC. The ASIC may be standard, fully customized or partially customized. In one example, the ASIC may have a structured design. The ASIC may comprise at least one microprocessor and/or at least one memory block. In another example, the ASIC may comprise at least one gate array, e.g. a field-programmable gate array. The field-programmable gate array may comprise an array of programmable logic blocks and a hierarchy of reconfigurable interconnects. The array of programmable logic blocks may, in certain examples, comprise memory elements, e.g. flip-flops. The ASIC may, in one example, be arranged to obtain the digital representation at block 510. The ASIC may be communicatively coupled to at least one central processing unit, according to one example. The abutting surfaces in the digital representation may be modulated at block 520 by the at least one central processing unit. The at least one central processing unit may comprise at least one of a general-purpose central processing unit and a specific-purpose central processing unit.

Figure 6A:
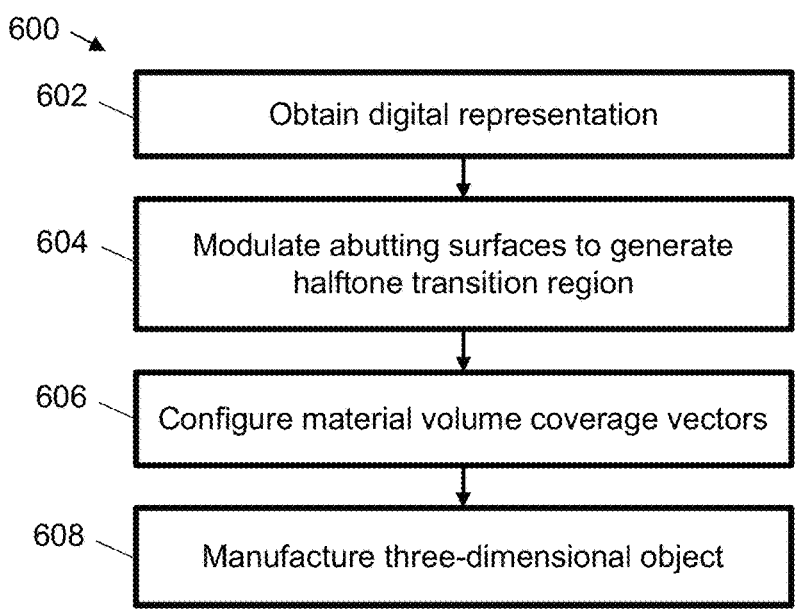
FIG. 6a is a flow diagram showing a method for manufacturing a three-dimensional object according to an example.

FIG. 6a shows a method 600 for manufacturing a three-dimensional object according to an example. This method may be applied by any one of apparatus 100 and deposit controller 220, by another additive manufacturing system or by a computer device arranged to control an additive manufacturing system. At block 602, a digital representation, e.g. object data, is obtained, representative of the three-dimensional object to be manufactured. The digital representation represents at least a first and a second object part. The first object part is associated with a first material composition and the second object part is associated with a second material composition. The first and the second object parts are arranged such that they have abutting surfaces, e.g. such that they comprise a contiguous interface. At block 604, the abutting surfaces of the first and the second object parts in the digital representation are modulated, e.g. the contiguous interface is modulated. The modulating the abutting surfaces comprises generating a halftone transition region for the abutting surfaces. The halftone transition region comprises material composition placement instructions for manufacture of the three-dimensional object, wherein volumes of the first material composition are interleaved with volumes of the second material composition. In one example, the generation of the halftone transition region may be based on a predefined transition metric. The predefined transition metric may, in one example, be a blurring radius.

At block 606, a set of material volume coverage vectors are configured for a set of respective volumes of the three-dimensional object, the set of respective volumes corresponding to portions of at least one of the first and the second object parts that are included in the halftone transition region. In one example, the set of material volume coverage vectors may be configured to have non-zero probability values for vector components respectively representing the first and the second production material compositions individually. In another example, the set of material volume coverage vectors may be configured to have non-zero probability values for a vector component representing a combination of the first and the second production material compositions. The configuring of the set of material volume coverage vectors at block 606 is performed prior to the application of a halftoning operation to the digital representation of the three-dimensional object. At block 608, the three-dimensional object is manufactured based on the modulated surfaces in the digital representation. The manufacture may comprise applying a halftoning operation to the digital representation based on the configured set of material volume coverage vectors, to generate discrete material formation instructions.

Figure 6B:
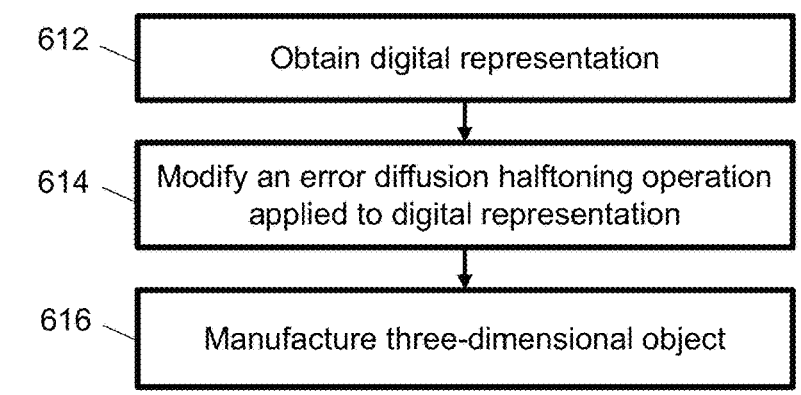
FIG. 6b is a flow diagram showing a method for manufacturing a three-dimensional object according to an example.

FIG. 6b shows a method 610 for manufacturing a three-dimensional object, according to an example. This method may be applied by any one of apparatus 100 and deposit controller 220, by another additive manufacturing system or by a computer device arranged to control an additive manufacturing system. At block 612, a digital representation, e.g. object data, is obtained, representative of the three-dimensional object to be manufactured. The digital representation represents at least a first and a second object part. The first object part is associated with a first material composition and the second object part is associated with a second material composition. The first and the second material compositions may be production material compositions. The first and the second object parts have abutting surfaces, e.g. they are arranged such that they comprise a contiguous interface. At block 614, the abutting surfaces in the digital presentation are modulated, e.g. the contiguous interface is modulated. The modulating the abutting surfaces comprises modifying an error diffusion halftoning operation applied to the digital representation. In one example, modifying the error diffusion halftoning operation may comprise pre-defining certain volumes as 'closed' for at least one of the material combinations. The error diffusion halftoning operation may, in one example, be applied to object data representative of a halftone transition region such as that generated in method 600. At block 616, the three-dimensional object is manufactured, wherein said manufacture may be based on a set of control instructions output by a halftoning operation.

Figure 6C:
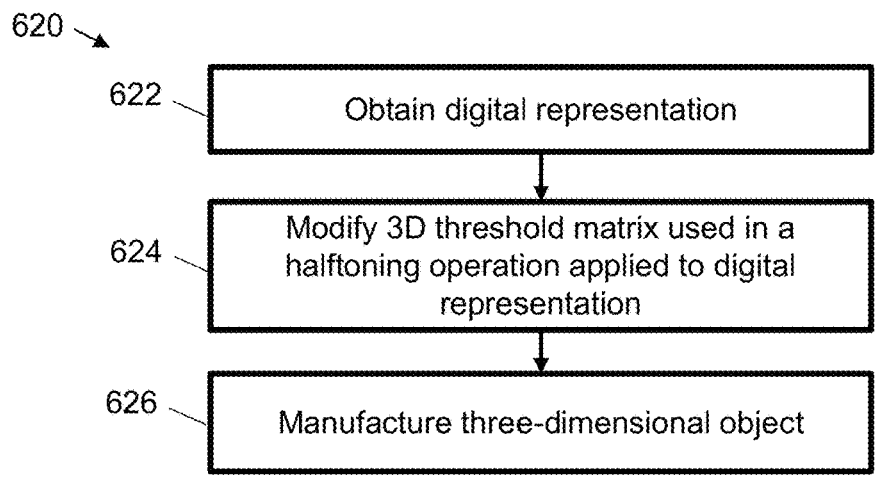
FIG. 6c is a flow diagram showing a method for manufacturing a three-dimensional object according to an example.

FIG. 6c shows a method 620 for manufacturing a three-dimensional object, according to an example. This method may be applied by any one of apparatus 100 and deposit controller 220, by another additive manufacturing system or by a computer device arranged to control an additive manufacturing system. At block 622, a digital representation, e.g. object data, is obtained, representative of the three-dimensional object to be manufactured. The digital representation represents at least a first and a second object part. The first object part is associated with a first material composition and the second object part is associated with a second material composition. The first and the second object parts have abutting surfaces, e.g. they are arranged such that they comprise a contiguous interface. At block 624, the abutting surfaces in the digital representation are modulated, e.g. the contiguous interface is modulated. The modulating the abutting surfaces comprises modifying at least one three-dimensional threshold matrix used in a halftoning operation applied to the digital representation. In one example, the modification of the at least one three-dimensional threshold matrix may be applied for a halftone transition region such as that generated in method 600. The modulating the abutting surfaces may, in one example, comprise determining a three-dimensional threshold matrix whose data values comprise the result of a subtraction of data values of a predefined three-dimensional threshold matrix from a maximum encoded level value. In one example, the predefined three-dimensional threshold matrix and the determined three-dimensional threshold matrix may be co-optimized such that a combing of two material compositions is avoided. In one example, the predefined three-dimensional threshold matrix may be associated with one of the first and the second object parts, and the determined three-dimensional threshold matrix may be associated with the other of the first and the second object parts. At block 626, the three-dimensional object is manufactured, wherein said manufacture may be based on a set of control instructions output by a halftoning operation. The halftoning operation may be applied to object data in association with the at least one three-dimensional threshold matrix modified at block 624.

Figure 6D:
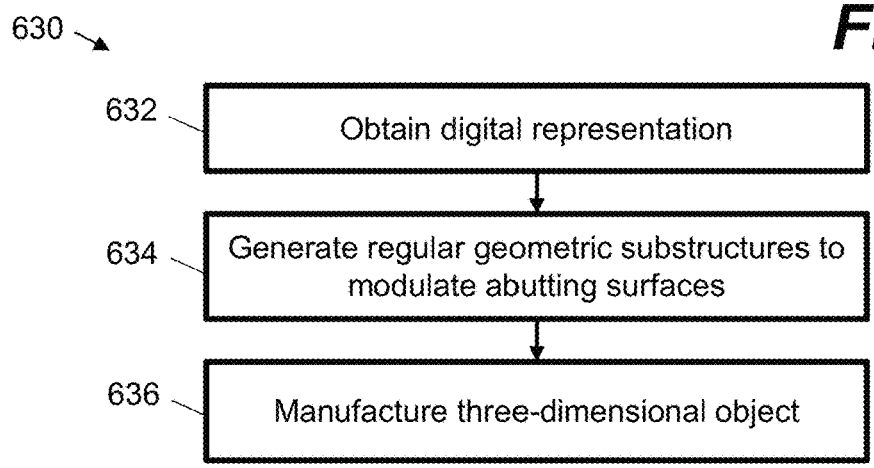
FIG. 6d is a flow diagram showing a method for manufacturing a three-dimensional object according to an example.

FIG. 6d shows a method 630 for manufacturing a three-dimensional object, according to an example. This method may be applied by any one of apparatus 100 and deposit controller 220, by another additive manufacturing system or by a computer device arranged to control an additive manufacturing system. At block 622, a digital representation, e.g. object data, is obtained, representative of the three-dimensional object to be manufactured. The digital representation represents at least a first and a second object portion. The first object portion is associated with a first material composition and the second object portion is associated with a second material composition. The first and the second material compositions may be production material compositions. The first and the second object portions have abutting surfaces, e.g. they are arranged such that they comprise a contiguous interface. At block 624, the abutting surfaces in the digital representation are modulated, e.g. the contiguous interface between the first and the second object portions is modulated. The modulating the abutting surfaces comprises generating a plurality of regular substructures associated with at least one of the first and the second material compositions. Each substructure is arranged to extend into object space occupied by a respective one of the second and first object portions. The substructures may, according to one example, be geometric contours each comprising at least one concavity. In one example, the substructures may be arranged such that they are aligned normal to the abutting surfaces. In an example, the substructures may be arranged to have a fixed orientation. In another example, the substructures may be arranged to have a variable orientation. The substructures may, in one case, be arranged with a varying density along the abutting surfaces. In one example, the substructures may be generated during a halftoning operation. In another example, the substructures may be generated during a preprocessing stage of a printing operation, prior to an application of a halftoning operation. The modulating the abutting surfaces by generating substructures may be implemented in concert with at least a portion of any of the methods set out in methods 600, 610 or 620, according to certain examples. In one example, the substructures may be generated prior to at least a portion of any of the methods set out in methods 600, 610 or 620. In another example, the substructures may be generated without any of the methods set out in methods 600, 610 or 620 being performed, for a given manufacturing operation.

Figure 7:
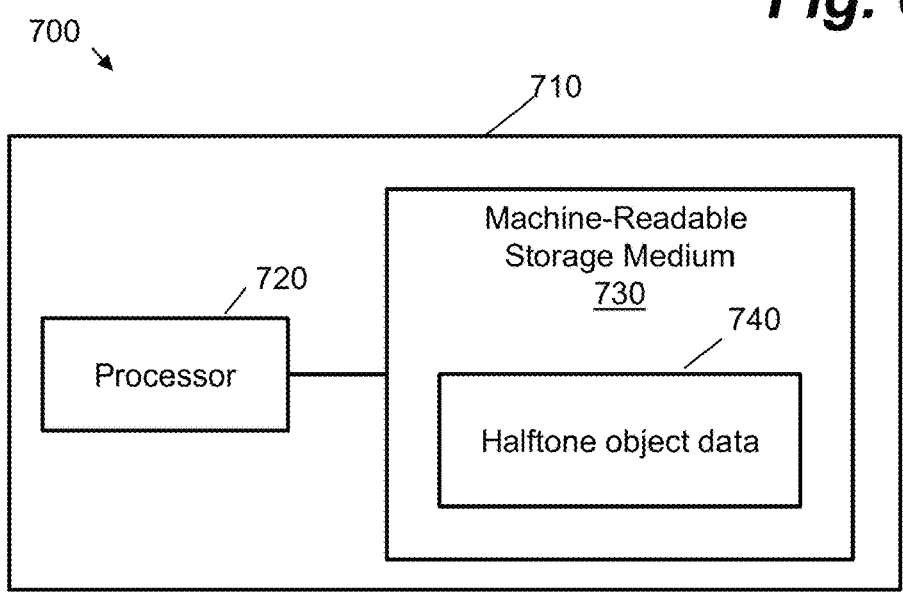
FIG. 7 is a schematic diagram showing a computing device for manufacturing a three-dimensional object according to an example.

Certain methods and systems as described herein may be implemented by a processor that processes instructions that are stored in a non-transitory machine-readable storage medium. FIG. 7 shows an example 700 of a computing device 710 (e.g. structural modifier 120, 170, halftone generator 180, etc.) comprising a non-transitory machine-readable storage medium 740 coupled to a processor 720 (e.g. at least one processor). In certain cases the computing device 710 may comprise a special-purpose computer or the like. Machine-readable media 730 can be any non-transitory media that can contain, store, or maintain programs and data for use by or in connection with the processor 720, or another suitable processor. Machine-readable storage media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc. In FIG. 7, the machine-readable storage medium may comprise program code, e.g. in the form of firmware, to implement at least a portion of any of the methods 500, 600, 610, 620 or 630, according to an example. Firmware may comprise machine readable-instructions 740 and/or executable code that comprises instructions for the at least one processor 720.

In one case, the machine-readable instructions 740, when executed by at least one processor 720, cause the at least one processor 720 to obtain object data representative of a three-dimensional object to be manufactured. The object data represents at least a first and a second part of the three-dimensional object, the first part being associated with a first production material composition and the second part being associated with a second production material composition. The first and the second parts are arranged in the three-dimensional object such that they comprise a shared contiguous interface. The machine-readable instructions 740 may further cause the at least one processor 720 to halftone said object data by converting the shared contiguous interface into a transition region. The transition region may comprise material composition placement instructions for the manufacture of the three-dimensional object, wherein volumes of the first production material composition are interleaved with volumes of the second production material composition. In one example, the shared contiguous interface may be modulated by configuring a set of material volume coverage vectors for a set of volumes corresponding to portions of at least one of the first and second object parts that are included in the transition region, prior to the application of the halftoning operation. In another example, the shared contiguous interface may be modulated by modifying an error diffusion halftoning operation applied to the object data. In a further example, the modulating the contiguous interface may comprise modifying at least one three-dimensional halftone matrix used in the halftoning operation. The obtained object data may, in one case, comprise a plurality of regular substructures associated with at least one of the first and the second production material compositions, each substructure arranged to extend into object space occupied by a respective one of the second and first object parts. The machine-readable instructions 740 may further cause the at least one processor 720 to output control data comprising discrete material formation instructions for the manufacture of the three-dimensional object.

Certain examples described herein enable a digital representation of a three-dimensional object, e.g. a three-dimensional raster representation, to be modified in a manner to generate a strong, adhesive interface between at least two object portions, wherein the at least two object portions are comprised of printing materials which may have differing mechanical, structural and/or fusing properties. This is achieved by providing an apparatus and method for preprocessing the digital representation and manufacturing the three-dimensional object according to the modified representation. Object data is obtained, representing at least a first and a second object part, the first object part being associated with a first production material composition and the second object part being associated with a second production material composition, the first and the second object parts being arranged such that they are separated by a contiguous interface. Said object data is modified by modulating the contiguous interface between the first and the second object parts. Said modulating comprises modulating data defining at least one of the first and the second object parts such that a portion of at least one of the first and the second production material compositions extends into object space occupied by a respective one of the second and first object parts. The object data may be halftoned to output discrete material formation instructions for the manufacture of the three-dimensional object, the discrete material formation instructions usable for the deposition of production material compositions during a print production operation.

Certain examples also enable structural control to be applied to the generation of a three-dimensional object in a manner that is computationally efficient and may be parallelized. Certain examples enable three-dimensional objects to be produced with structurally strong interfaces between object portions having different material compositions. Even material compositions which are highly incompatible when printed contiguously, such as metals and plastics, or metals and flexible materials, may be printed with a high degree of strength, adhesion and flexibility using the examples described herein. Modulation of a contiguous interface between two adjacent object portions may, according to certain described examples, be achieved by one or both of: a geometric modification of the interface, and a conversion of the abrupt interface into a halftone transition region. Depending on the desired application (e.g. printing small features, varying throughput, etc.), structural integrity along interfaces may be achieved across a broad range of scenarios.

The preceding description has been presented to illustrate and describe examples of the principles described. This description is not intended to be exhaustive or to limit these principles to any precise form disclosed. Many modifications and variations are possible in light of the above teaching. Techniques, functions and approaches described in relation to one example may be used in other described examples, e.g. by applying relevant portions of that disclosure.

What is claimed is:

1. An apparatus arranged to preprocess object data for the manufacture of a three-dimensional object, the apparatus comprising:
   a data interface arranged to receive object data representative of the three-dimensional object for manufacture, the object data representing at least a first and a second object part, the first object part being associated with a first production material composition and the second object part being associated with a second production material composition, the first and the second object parts being arranged such that they are separated by a contiguous interface;
   a structural modifier arranged to modify said object data by modulating the contiguous interface between the first and the second object parts, said modulating comprising modulating data defining at least one of the first and the second object parts such that a portion of at least one of the first and second production material compositions extends into object space occupied by a respective one of the second and first object parts; and
   a deposit controller to communicate with a deposit mechanism to manufacture the three-dimensional object based on the modulated contiguous interface between the first and the second object parts.

2. The apparatus according to claim 1, comprising a halftone generator arranged to apply a halftoning operation to the object data to output discrete material formation instructions for the manufacture of the three-dimensional object.

3. The apparatus according to claim 2, wherein the structural modifier is arranged to modulate the contiguous interface in the received object data to generate a halftone transition region for the contiguous interface, the halftone transition region comprising material composition placement instructions for manufacture of the three-dimensional object wherein volumes of the first production material composition are interleaved with volumes of the second production material composition.

4. The apparatus according to claim 3, wherein the structural modifier is arranged to modify the contiguous interface by configuring a set of material volume coverage vectors for a set of respective volumes of the three-dimensional object prior to application of the halftoning operation by the halftone generator,
   wherein, for k materials available for manufacture of the three-dimensional object and L discrete material formation states for said materials, a material coverage vector comprises $L^k$ vector components, each vector component having an associated probability value,
   wherein the set of respective volumes correspond to portions of at least one of the first and second object parts that are included in the halftone transition region, and
   wherein the structural modifier is arranged to configure the set of material volume coverage vectors to have non-zero probability values for at least one of:
     vector components respectively representing the first and second production material compositions individually, and a vector component representing a combination of the first and second production material compositions.

5. The apparatus according to claim 2, wherein the structural modifier is arranged to modulate the contiguous interface by modifying an error diffusion halftoning operation performed by the halftone generator.

6. The apparatus according to claim 2, wherein the structural modifier is arranged to modulate the contiguous interface by modifying at least one three-dimensional threshold matrix used by the halftone generator.

7. The apparatus according to claim 1, wherein the structural modifier is arranged to replace object data for the contiguous interface with object data representing a plurality of repeated geometric substructures composed of at least one of the first and the second production material compositions, each substructure being arranged to extend into object space occupied by a respective one of the second and first object parts.

8. The apparatus according to claim 1, wherein one of the first and second object parts represents a core of the three-dimensional object and the other of the first and second object parts represents a shell of the three-dimensional object, the shell being arranged to surround the core.

9. A method of manufacturing a three-dimensional object, comprising:
obtaining a digital representation of the three-dimensional object to be manufactured, the digital representation representing at least a first and a second object portion, the first object portion being associated with a first material composition and the second object portion being associated with a second material composition, the first and the second object portions having abutting surfaces;
modulating the abutting surfaces defined in the digital representation, including causing an ingress of a portion of at least one of the first and second material compositions into a volume occupied by a respective one of the second and first object portions; and
manufacturing the three-dimensional object based on the modulated surfaces in the digital representation.

10. The method according to claim 9, comprising:
modulating the abutting surfaces in the digital representation to generate a halftone transition region for the abutting surfaces, the halftone transition region comprising material composition placement instructions for manufacture of the three-dimensional object wherein volumes of the first material composition are interleaved with volumes of the second material composition.

11. The method according to claim 10, comprising:
modulating the abutting surfaces by configuring a set of material volume coverage vectors for a set of respective volumes of the three-dimensional object prior to application of a halftoning operation to the digital representation,
wherein, for k materials available for manufacture of the three-dimensional object and L discrete material formation states for said materials, a material coverage vector comprises $L^k$ vector components, each vector component having an associated probability value,
wherein the set of respective volumes correspond to portions of at least one of the first and second object portions that are included in the halftone transition region, and
wherein the set of material volume coverage vectors are configured to have non-zero probability values for at least one of:
vector components respectively representing the first and second material compositions individually, and
a vector component representing a combination of the first and second material compositions.

12. The method according to claim 9, wherein modulating the abutting surfaces comprises modifying an error diffusion halftoning operation applied to the digital representation.

13. The method according to claim 9, wherein modulating the abutting surfaces comprises modifying at least one three-dimensional threshold matrix used in a halftoning operation applied to the digital representation.

14. The method according to claim 9, wherein modulating the abutting surfaces comprises generating a plurality of regular substructures associated with at least one of the first and the second material compositions, each substructure arranged to extend into object space occupied by a respective one of the second and first object portions.

15. A non-transitory machine readable medium comprising instructions which, when executed by at least one processor, cause the processor to:
obtain object data representative of a three-dimensional object to be manufactured, the object data representing at least a first and a second part of the three-dimensional object, the first part being associated with a first production material composition and the second part being associated with a second production material composition, the first and the second parts of the three-dimensional object being arranged such that the first and second parts comprise a shared contiguous interface;
halftone said object data by converting the shared contiguous interface into a transition region, the transition region comprising material composition placement instructions for manufacture of the three-dimensional object wherein volumes of the first production material composition are interleaved with volumes of the second production material composition; and
output control data comprising discrete material formation instructions for the manufacture of the three-dimensional object.

* * * * *